(12) United States Patent
Mashiko et al.

(10) Patent No.: US 6,253,829 B1
(45) Date of Patent: Jul. 3, 2001

(54) HEAT SINK, AND PROCESS AND APPARATUS FOR MANUFACTURING THE SAME

(75) Inventors: Koichi Mashiko; Masataka Mochizuki; Kazuhiko Goto; Yuji Saito; Yoshihiro Nagaki, all of Tokyo (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 09/551,954

(22) Filed: Apr. 19, 2000

Related U.S. Application Data

(62) Division of application No. 08/971,688, filed on Nov. 17, 1997, now Pat. No. 6,085,830.

(30) Foreign Application Priority Data

| Mar. 24, 1997 | (JP) | 9-88878 |
| May 15, 1997 | (JP) | 9-140966 |
| Aug. 25, 1997 | (JP) | 9-243322 |
| Sep. 3, 1997 | (JP) | 9-254294 |
| Sep. 3, 1997 | (JP) | 9-254295 |

(51) Int. Cl.[7] ............................ B22D 19/00; B22D 17/24
(52) U.S. Cl. .................. 164/109; 164/112; 164/332; 164/333; 164/334; 164/120; 164/319; 164/288
(58) Field of Search .................................. 164/109, 112, 164/332, 333, 334, 120, 319, 288

(56) References Cited

U.S. PATENT DOCUMENTS

| 1,616,626 | * | 2/1927 | Hughes | 164/112 |
| 1,731,445 | * | 10/1929 | Thomann | 164/112 |
| 2,332,330 | * | 10/1943 | McMahan | 164/112 |
| 3,147,802 | | 9/1964 | Katz | 165/185 |
| 4,449,578 | | 5/1984 | Munekawa | 165/104.33 |
| 4,981,172 | | 1/1991 | Haerle | 165/133 |
| 5,038,858 | | 8/1991 | Jordan et al. | 165/185 |
| 5,095,973 | | 3/1992 | Toy | 165/185 |
| 5,224,538 | | 7/1993 | Jacoby | 165/166 |
| 5,351,748 | * | 10/1994 | Dagan | 165/80.3 |
| 5,535,515 | | 7/1996 | Jacoby | 165/185 X |
| 5,542,176 | | 8/1996 | Serizawa et al. | 165/185 X |
| 5,562,146 | * | 10/1996 | Harmon et al. | 164/333 |
| 5,623,984 | * | 4/1997 | Nozaki et al. | 164/120 |

FOREIGN PATENT DOCUMENTS

9-181231   7/1997   (JP) .

* cited by examiner

Primary Examiner—Tom Dunn
Assistant Examiner—I.-H. Lin
(74) Attorney, Agent, or Firm—Oblon, Spivak, McClelland, Maier & Neustadt, P.C.

(57) ABSTRACT

A process for manufacturing a heat sink, in which a plate-shaped base portion is formed by the diecasting method integrally with the one-end portions of a plurality of fins arrayed at a constant pitch and in parallel with each other.

7 Claims, 16 Drawing Sheets

HEAT SINK, AND PROCESS AND APPARATUS FOR MANUFACTURING THE SAME

This application is a divisional of application Ser. No. 08/971,688 filed Nov. 17, 1997 now U.S. Pat. No. 6,085,830.

BACKGROUND OF THE INVENTION

1. Field of the Invention

The present invention relates to a heat sink for enlarging a heat exchanging area in various heat exchanging devices or heat transfer devices and, more particularly, to a process for manufacturing a heat sink, which is constructed to protrude a number of radiation members into a base portion, and an apparatus for carrying out the process.

2. Related Art

In order to improve the heat exchanging capacity of a thermal device such as a heat pipe by enlarging the heat radiating or absorbing area, it is widely executed in the prior art to employ a heat sink.

An example of this kind of heat sink is shown in FIGS. 30A and 30B. A heat sink 1, as shown in FIG. 30A, is equipped with a plurality of plate-shaped fins 2 arrayed in parallel with one another, and a plate-shaped base 3 projecting the fins 2. The heat sink 1 thus constructed is generally manufactured in the prior art by the extruding method using an aluminum alloy. In the heat sink 1 shown in FIG. 30B, on the other hand, the fins 2 acting as the radiation members are formed into a circular column shape. Moreover, the heat sink shown in FIG. 30B is generally manufactured in the prior art by the forging method using a copper alloy.

The fins 2 of the heat sink 1 are preferably arrayed as dense as possible. On the other hand, however, the extruding or forging method, as adopted as the method for manufacturing each of the aforementioned heat sinks 1, is intended to form the target shape by fluidizing the material. It is, therefore, necessary to introduce the material into the small clearances corresponding to the fins in the forming mold, when the heat sink is to be manufactured by the extruding or forging method. For the smaller sectional area of the clearances and for the longer introduction (corresponding to the length of the fins 2), however, the material becomes the more reluctant to flow. In the prior art, therefore, the minimum thickness t of the fins 2 is limited by about 2 mm. When the thickness t is set to 2 mm, the maximum height (or length) h of the fins 2 is limited by about 20 mm. From the requirement of the strength of the mold, on the other hand, the array pitch p of the fins 2 has to be 5 mm or more.

When the heat sink 1 is to be thus manufactured by the extruding or forging method, the fins 2 cannot be made thin and high, and the number of the fins 2 per unit area of the base 3 is restricted. This raises a disadvantage that the heat exchanging area of the heat sink to be achieved by the conventional method is restricted to a small value.

An invention capable of eliminating such a disadvantage is disclosed in Japanese Patent Laid-Open No.9-181231. The conventional process, as disclosed in this Laid-Open, will be briefly described with reference to FIGS. 31 and 32. In a heat sink 4 manufactured by this process, rectangular and thin fins 6 are integrated with a plate-shaped base 5. The fins 6 are prepared by cutting a rolled sheet of an aluminum alloy into a rectangular shape. These fins 6 are arrayed at a constant pitch by inserting them liquid-tight into the (not-shown) slits formed in the mold. Moreover, the one-end portions of the individual fins 6 are protruded from the mold. In this state, a molten metal of the aluminum alloy is poured into the end portions, as protruded from the mold of the fins 6 to form the shape of the base 5. Immediately before the complete solidification, moreover, the molten metal is pressurized for the forging effect.

According to this process, what is used is the fins 6 prepared prior to casting but not the casting fins 6, so that the thickness, height or pitch of the fins 6 is not restricted. Since the molten metal is pressurized midway of solidification, moreover, the defects such as air bubbles and so on in the base 5 can be eliminated.

According to the aforementioned conventional method of forming the base by casting forging the molten metal, however, the mold is closed after it is fed with the molten metal for the base, and the molten metal is pressurized to raise a problem that the time period required for molding the base is elongate to deteriorate the productivity. Moreover, the fins are made of the thin sheets, as described above, or replaced by thin pins. The fins of this structure are low in their own strength and are heated and cooled at the time of molding the base. This raises another disadvantage that the strength is further lowered. The fins thus having lowered the strength are deformed while they are being used. As a result, the adjoining fins come into contact to invite a problem that their radiation area is reduced to deteriorate the radiation efficiency.

SUMMARY OF THE INVENTION

A main object of the invention is to provide a process for manufacturing a heat sink having a large surface area at its radiation fins quickly and highly efficiently.

Another object of the invention is to improve the strength of radiation fins having a small thickness and a small pitch.

In the invention, therefore, the one-end portions of radiation fins arrayed at a constant pitch are protruded into a diecasting cavity, and a molten metal under a high pressure is poured into the cavity. As a result, the one-end portions of the radiation fins are cast with the molten metal. When the molten metal in the cavity solidifies, the base is molded integrally with the radiation fins. Thus, according to the process of the invention, the portion of the base carrying the radiation fins can be diecast to manufacture the heat sink including the base having a dense metallic structure with no defect quickly and highly efficiently.

According to the process of the invention, moreover, the molten metal in the cavity may be pressurized by reducing the capacity of the cavity immediately before the molten metal completely solidifies. By performing the so-called "secondary pressurization", the casting defects at the portion of the base are eliminated more reliably.

In the invention, still moreover, the projections along the surface of the one-end portions of the radiation fins may be formed on the base. These projections act to increase the penetration depth of the radiation members into the base thereby to improve the mounting strength of the radiation fins on the base.

According to the process of the invention, reinforcing ribs may be formed in advance on the radiation members. Moreover, the radiation fins may be heated to improve their strength after the diecasting treatment or hardened to raise their strength by compressing them. Still moreover, a prepared heat pipe can be arranged in a diecasting cavity and cast therearound by the molten metal to provide a construction in which the heat pipe is mounted in the base integrated with the fins.

The above and further objects and novel features of the invention will more filly appear from the following detailed description when the same is read with reference to the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Figure 1:
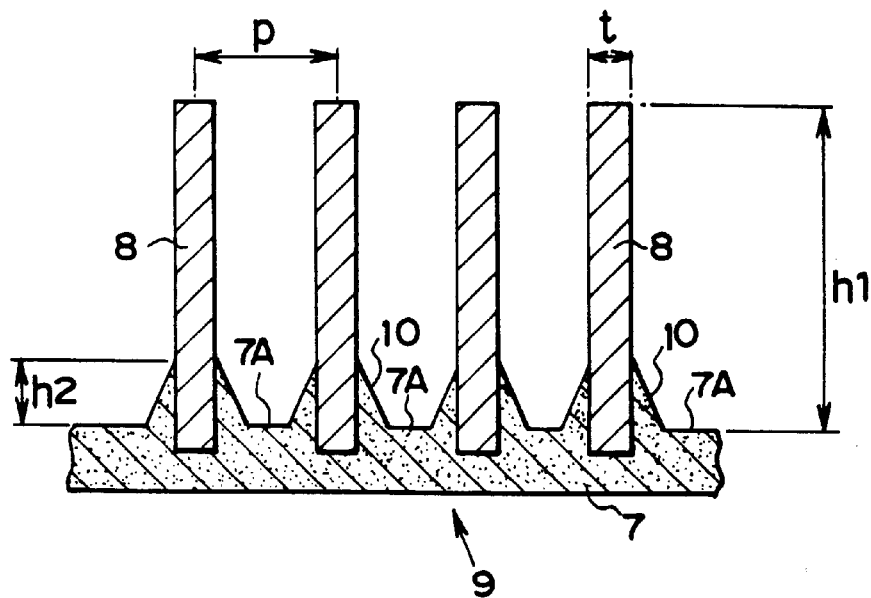
FIG. 1 is a section showing a portion of a heat sink according to the invention.

One specific embodiment of the invention will be described with reference to FIG. 1. This embodiment is exemplified by adopting plate fins as a radiating member. In the upper face of a base 7, as shown in FIG. 1, there are anchored a plurality of fins 8 extending upright. These base 7 and fins 8 construct a heat sink 9 together. The base 7 is a generally square or rectangular plate of copper having a thickness of about 1 to 3 mm, for example.

On the other hand, the fins 8 are exemplified by plates having a thickness t of 1.5 mm and a height h of 20 mm or more. As a result, the ratio C of the thickness t to the height h of the fins 8 is set to $C=h/t=20/0.5=40$ or more. Moreover, a pitch p between the individual fins 8 is set to 2 mm. Here, the penetration depth of the fins 8 into the base 7 is set to 1 to 2 mm. On the other hand, the fins 8 are made of aluminum. Specifically, the fins 8 and the base 7 are made of such a material as to alloy their jointed portions when they are assembled by the diecasting method, as will be described hereinafter.

Here are enumerated other combinations of the materials for the base 7 and the fins 8 by Al—Mg and Al-graphite and so on. It is preferable to select materials having a thermal conductivity as high as possible and an excellency in the so-called "casting characteristics" from those combinations.

Of the upper face of the base 7, on the other hand, the two side portions interposing each fin 8 are raised along the side faces of the fin 8 to form support projections or ridges 10. Of the upper face of the base 7, the portions other than the support ridges 10, that is, the portions between the support ridges 10 are flat portions 7A having equal thicknesses. Here, the penetration depth of the fins 8 into the base 7 is set to 1 to 2 mm from the flat portions 7A.

The support ridges 10 are exemplified by pairs of ridges having triangular sections and confronting each other. In this specific embodiment, the height (h2) of the support ridges 10 from the flat portions 7A of the base 7 is set to have an area to contact with the fins 8 about 15% larger than that of the construction in which the fins 8 are just erected from the flat portions 7A. In other words, the contact area between the support ridges 10 and the individual fins 8 is larger by about 15% than the construction in which the fins 8 are just erected from the flat portions 7A. Thus, the fins 8 are embedded in and supported at the peripheral portions of their roots by the support ridges 10 which are integrally made of the material identical to that of the base 7.

Figure 2:
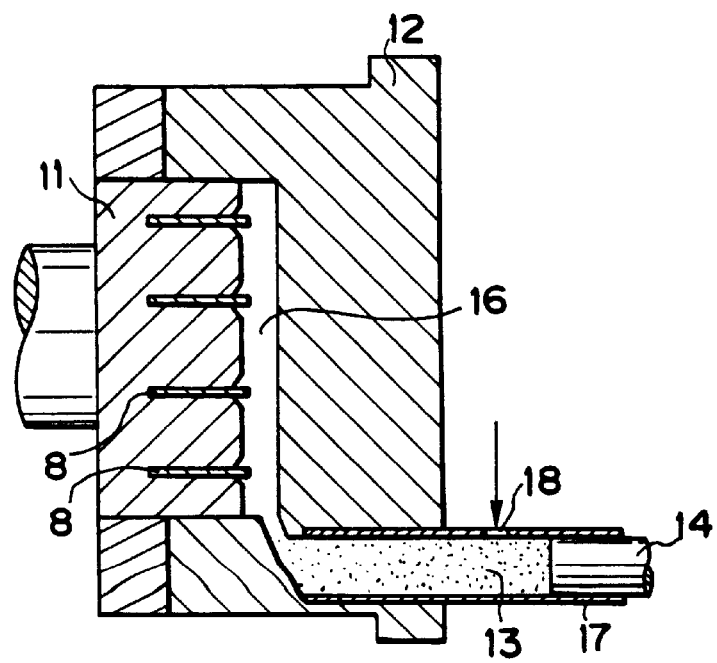
FIG. 2 is a section schematically showing one example of an apparatus for manufacturing the heat sink according to the invention.

Here, the process for manufacturing the heat sink 9, that is, the process for anchoring the fins 8 to the base 5 can be effected by the well-known diecasting method, for example, as shown in FIG. 2. The respective one-side end portions (i.e., the upper end portions) of the fins 8 are held in the aforementioned pitch and position by a movable mold 11. Then, the lower end portions of the fins 8 are held to protrude by about 1 to 2 mm into the internal space of a stationary mold 12. This protrusion is the aforementioned penetration depth of the fins 8 into the base 7. In the bottom face of the movable mold 11, there are formed recesses or grooves for forming the support ridges 10. In this specific embodiment, therefore, a cavity 16 is formed by the internal space of the movable mold 11 and the grooves in the bottom face of the stationary mold 12.

On the contrary, the bottom face of the stationary mold 12 is formed into a flat face. To this stationary mold 12, there is connected an injection sleeve 17 for injecting a molten metal 13 of Cu for the material of the base 7. In the upper face of the injection sleeve 17, there is formed an inlet 18 for pouring the molten metal 13. In the injection sleeve 17, moreover, there is fitted a plunger 14 which will move back and forth across the opening of the inlet 18. This plunger 14 is connected to a cylinder to be actuated by a hydraulic pressure, such as the not-shown hydraulic cylinder. When the plunger 14 is moved toward the movable mold 11 from the state shown in FIG. 2 to the state shown in FIG. 3, the molten metal 13 is injected under a high pressure and at a high speed into the cavity 16. As a result, the other end portions of the fins 8 are inserted by about 1 to 2 mm into the molten metal 13.

When the lower end portions of the fins 8 are contacted by the molten metal 13 of Cu, their surfaces are melted because Al has a lower melting point than that of Cu, so that the base 7 and the fins 8 are alloyed. Because of the combination of Cu and Al, their solid solution or their intermetallic compound exits in the structure, or the two components coexist in dependence upon the concentrations of the components. More specifically, the heat sink 9 of this specific embodiment has a construction in which the fins 8 and the base 7 are jointed to each other such that at least one component is alloyed by the other.

When the solid solution is made, as described above, the distortion in the vicinity of the dislocation is reduced to suppress the mobilities of Cu and Al due to the difference between the atomic radii of the two metals. When the solid solution forms a regular lattice, moreover, the slip is restricted to increase the strength of the jointed portions between the base 7 and the fins 8. This joint strength is further improved if a compound is made of Cu and Al and if another compound is made of the former compound and the component metals or their solid solution.

By performing the cooling and cleaning steps subsequent to the aforementioned injection step as in the ordinary diecasting method, a series of manufacturing works can be completed to joint the base 7 and the fins 8 firmly thereby to provide the heat sink 9 having an extremely small number of casting defects such as voids in the base 7. Moreover, the heat sink 9 of this specific embodiment is constructed such that the roots of the fins 8 are embedded in the base 7 and such that the support ridges 10 extending from the surface of the base 7 to the upper end portions of the fins 8 are integrally formed on the base 7 to cover the roots of the fins 8.

Thus, according to the specific embodiment, when the base 7 is to be cast, the jointed portions between the fins 8 and the base 7 are alloyed and enabled to retain the large areas by the support ridges 10 so that the joints between the fins 8 and the base 7 can be more strengthened than in the prior art to prevent the fins 8 from coming out of the base 7 without fail. By adopting the method of anchoring the fins 8 of a rolled sheet in the base 7 by the diecasting method, the fins 8 can be made thin and high with the small pitch so that the heat sink 9 can have a large heat exchanging area in its entirety. As a result, it is possible to provide the heat sink 9 which is strong and has a large heat exchanging area. Moreover, the base 7 is cast by the diecasting method to integrate the fins 8 and the base 7 into the heat sink 9 so that the productivity of the heat sink 9 can be improved by increasing the number of shots for a unit time period.

Another specific embodiment of the heat sink according to the invention will be described with reference to FIG. 4. In this embodiment, the fins have anchoring portions. Here, the same members as those of the foregoing embodiment are designated by the same reference numerals, and their detailed description will be omitted In the upper face of the base 7 having a plate shape, there are anchored in parallel at a pitch of about 2 mm the fins 8 which are made of a plurality of rolled sheets. The lower end portions, as cast in the base 7, of the individual fins 8, are formed into such anchoring portions 15 as are transversely expanded or diverged gradually downwards of FIG. 4. In other words, the individual fins 8 are anchored in the base 7 such that their anchoring portions are completely buried in the base 7.

In short, this heat sink 9 is constructed such that the roots of the fins 8 are anchored in the base 7 and such that the anchoring portions 15 bulging at a right angle with respect to the thick directions of the base 7 are formed at the roots of the fins 8. Here, the anchoring portions 15 can be easily worked at the step of rolling the fins 8. Here, the shapes of the anchoring portions 15 can be modified by merely folding the end portions of the fins into an L-shape.

Figure 4:
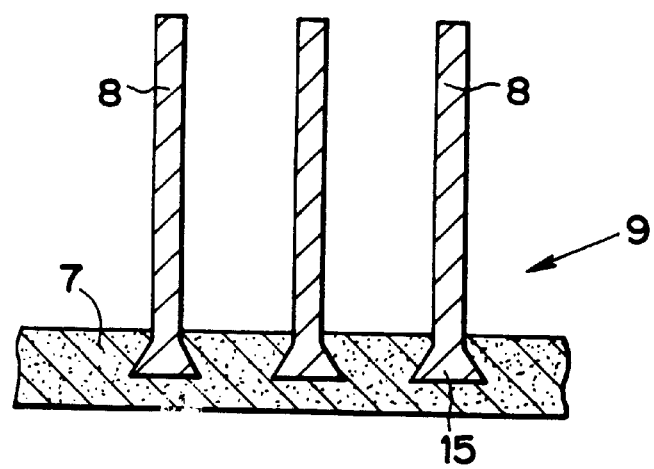
FIG. 4 is a section showing a portion of a heat sink according to another embodiment of the invention.

According to the heat sink 9 thus constructed, therefore, the fins 8 can be reliably prevented from coming out of the base 7 not only because the joints between the fins 8 and the base 7 are strengthened by their alloying as in the foregoing specific embodiment of FIG. 1 but also because the individual fins 8 are regulated from coming out of the base 7, that is, from moving upward of FIG. 4 by the anchoring portions 15 bulging transversely of FIG. 4.

The plate fins have been exemplified in the foregoing specific embodiments, but the invention should not be limited to the embodiments but may be modified such that the fins are made of corrugated sheets, or circular columns or prisms. In addition to the aforementioned construction equipped with either the support ridges or the anchoring portions, the invention may be embodied by another construction which is equipped with both the support ridges and the anchoring portions. Moreover, the fins of the invention can be made of not only the rolled sheet but also a machined or cast sheet. In addition, the material for the fins or the base has been exemplified by copper or aluminum, but the invention should not be limited thereto but can adopt graphite or magnesium and so on.

In the foregoing embodiments, the base 7 is prepared by the simple diecasting method. In the invention, however, the molten metal, as injected into the cavity, may be subjected to a secondary pressurization immediately before it is completely solidified, as will be exemplified in the following.

Figure 5:
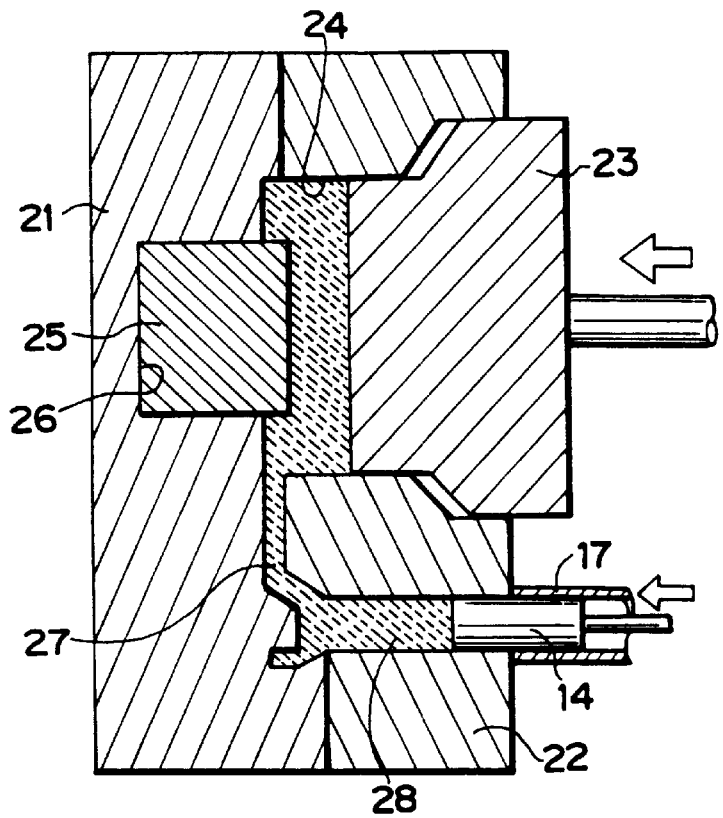
FIG. 5 is a schematic section showing one embodiment of the heat sink manufacturing apparatus equipped with secondary pressurizing means according to the invention.

FIG. 5 shows a diecasting mold apparatus which is constructed for the secondary pressurization. This mold apparatus is constructed to include a first mold 21, a second mold 22 and a third mold 23 and forms a cavity 24 generally at the center among these three molds 21, 22 and 23. In the first mold 21, moreover, there is formed a housing portion 26 which is positioned to face the cavity 24 for housing a plate- or block-shaped metal part 25 such as the fins 8 forming a part of the diecast. Between the first mold 21 and the second mold 22, on the other hand, there is formed a runner 27 which is in communication with the cavity 24. In the second mold 22, moreover, there is formed a sprue 28 in which the third mold 23 is slidably fitted and which is in communication with the cavity 24 through the runner 27. To the sprue 28, there is connected the injection sleeve 17, in which the plunger 14 is arranged to move back and forth.

Here, the third mold 23, as slidably fitted in the second mold 22, is connected to the not-shown hydraulic cylinder, toggle mechanism or crank mechanism. When this third mold 23 slides forward toward the first mold 21 (leftwardly of FIG. 5), the capacity of the cavity 24 is reduced to pressurize its inside molten metal additionally.

Here will be described the operations of the embodiment employing the diecasting mold apparatus thus constructed First of all, the third mold 23 is retracted to open the cavity 24, and the plate- or block-shaped metal part 25 is housed and fixed in the housing portion 26, as formed to face the cavity 24, of the first mold 21. At this time, the metal part 25 is made larger than the housing portion 26 so that its one end side (as located at the righthand end side of FIG. 5) of the metal part 25 protrudes into the cavity 24.

Next, the third mold 23 is advanced until it is fitted in the second mold 22. After this, the molten metal is poured under a high pressure and at a high speed into the cavity 24 which is defined by the first, second and third molds 21, 22 and 23. The molten metal is poured into the sprue 28 and is pressurized to a predetermined pressure by the plunger 14 to fill up the cavity 24 for a short time period.

At this pouring time, the gas defects such as blow holes are prevented as in the ordinary diecasting method by expelling the air smoothly from the cavity 24 and by releasing the air, as entrained by the molten metal, to the outside of the mold.

The molten metal in the cavity 24 is cooled under the pressure being kept, and is subjected, when it comes into a partially melted state, to the secondary pressurization by driving the third mold 23 forward.

At this time of secondary pressurization, the pressure by the plunger 14 is reset to a desired level so that either the plunger 14 or an (not-shown) actuator for driving the plunger 14 may act as a relief valve when the secondary pressure by the third mold 23 becomes excessive. Thus, it is possible to prevent not only the deformation of the mold, as might otherwise be caused when the secondary pressure is excessively high, but also the reduction in the molding accuracy, the shortening of the mold lifetime and the breakage of the mold, as will be caused by the mold deformation.

According to the process for manufacturing the heat sink of the embodiment, therefore, when the molten metal, as poured under pressure, for the base comes into the partially molten state, the third mold 23 is driven forward to effect the secondary pressurization so that the molten metal in the cavity 24 can be cast under a high pressure. As a result, when the plate-shaped metal parts 25 are so integrally cast that they are juxtaposed at a narrow pitch and bundled at their one-side ends, the individual plates, as protruding into the cavity 24, are filled up without any clearance. As a result, the casting defects including underfills or cavities can be reliably prevented to cast the individual plate-shaped metal parts firmly and integrally at their one-side ends. In short, it is possible to provide a heat sink having a high joint strength between the fins and the base.

Figure 6:
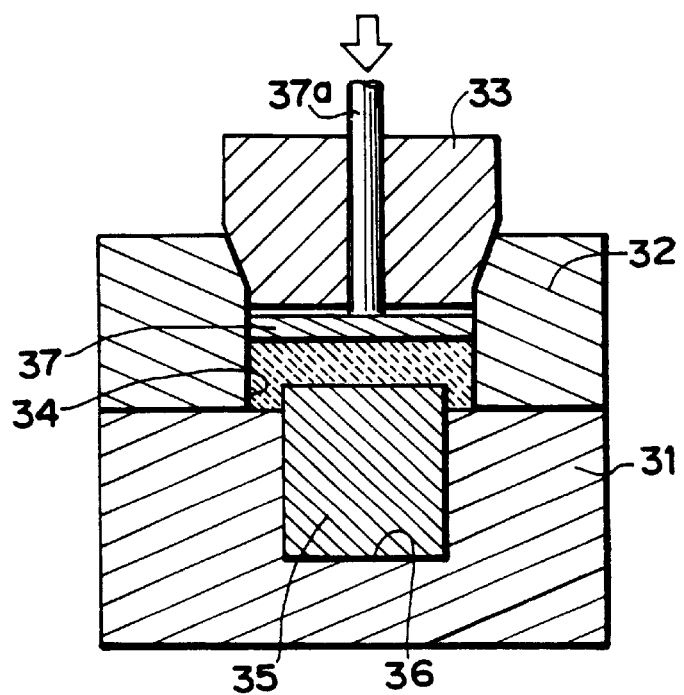
FIG. 6 is a schematic section showing another embodiment of the heat sink manufacturing apparatus equipped with secondary pressurizing means according to the invention.

FIG. 6 shows still another embodiment of the invention. In this embodiment, a secondary pressurization piston is fitted in a mold apparatus. Specifically, although the secondary pressurization of the partially molten metal in the cavity 24 is effected in the foregoing embodiment of FIG. 5 by sliding the third mold 23 forward, the molten metal in a cavity 34 is pressurized in the embodiment of FIG. 6 by driving a piston 37 which is fitted in the cavity 34.

More specifically, the mold apparatus of FIG. 6 is constructed to include a first mold 31, a second mold 32 and a third mold 33 to form the cavity 34 generally at the center of those three molds 31, 32 and 33. In the third mold 31, moreover, a housing portion 36 for housing a plate- or block-shaped metal part 35 forming a part of the product to be cast of this mold apparatus is formed to face the cavity 34. The third mold 33 is slidably fitted in the second mold 32 while leaving the cavity 34 between the third mold 33 and the first mold 31. The second mold 32 is provided with a (not-shown) sprue, from which the molten metal is poured under pressure into the cavity 34 via the runner. The device for pouring the molten metal may be exemplified by the aforementioned injection sleeve and plunger which are known in the prior art.

At the side of the third mold 33 facing the cavity 34, moreover, there is arranged the piston 37 which can slide vertically of FIG. 6 on the inner side face of the cavity 34. The piston 37 is connected to the lower end of a piston rod 37a vertically extending through the substantial center of the third mold 33. As a result, the piston 37 is driven to advance downward by a not-shown hydraulic cylinder.

Here will be described the process for manufacturing the heat sink of the invention employing the mold apparatus shown in FIG. 6. Before the mold is closed, the metal part 35 is so housed and fixed in the housing portion 36 that its portion protrudes into the cavity 34, and the individual molds 31, 32 and 33 are then assembled.

Next, the molten metal is injected into the cavity 34 which is defined by the individual molds 31, 32 and 33. This injection can be effected by moving the aforementioned plunger forward. As the molten metal is poured under pressure, the air is expelled from the cavity 34, and the air, as entrained by the molten metal, is also separated and expelled. At the instant when the molten metal is cooled to come into its partially molten state, the piston 37 is driven forward to pressurize the molten metal in the cavity 34 secondarily.

In the case of manufacturing the heat sink by employing the mold apparatus of FIG. 6, too, the molten metal for the base is subjected in the partially molten state to the secondary pressurization as in the embodiment of FIG. 5. As a result, no matter what a complicated shape the protrusion of the metal part 35 into the cavity 34 might take, the product having the metal part 35 integrated with that protrusion can be cast without any casting defects such as cavities.

Here, the foregoing individual embodiments have been described on the case in which the plate- or block-shaped metal part 25 or 35 is integrally diecast as the part of the product. Despite of this description, however, the metal part to be covered by the invention may be a rod-shaped metal part, a mesh metal part such as a metal lath or an expanded metal, or a punched or corrugated sheet such as a punched metal. Moreover, this metal part may be cast either in one sheet or integrally in a plurality.

In the foregoing specific embodiments, the metal part of a number of plate- or column-shaped fins is diecast while being held in the movable mold. In this case, the fins can be easily held in the movable mold, and the product can be easily parted from the movable mold by holding the metal part such as the fins in the movable mold in the following manner.

Figure 7:
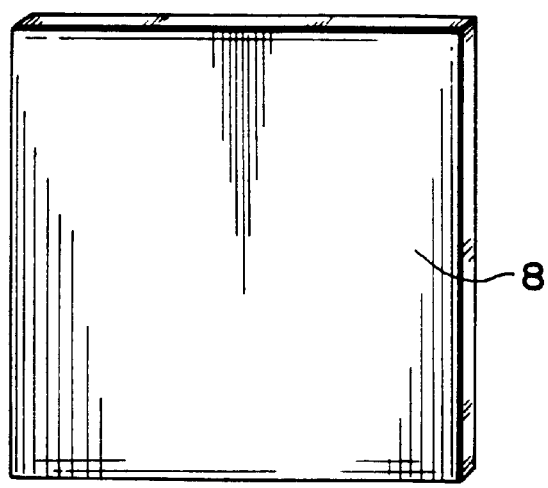
FIG. 7 is a perspective view showing a single element of a plate fin.
Figure 8:
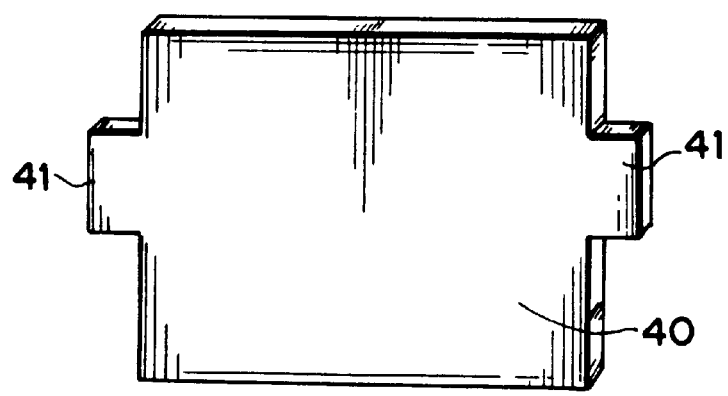
FIG. 8 is a perspective view showing a spacer to be interposed between the fins shown in FIG. 7.

FIG. 7 shows the fin 8 which is exemplified by a flat square sheet made of aluminum (Al) or its alloy. FIG. 8 is a schematic view showing a spacer 40 which is exemplified by a flat sheet made of Al or its alloy and having the same width size as that of the fin 8. At the edges of the two sides of the spacer 40, as shown in FIG. 8, there are individually formed engaging projections 41 which are projected widthwise from the central portions, as taken in the vertical direction. These engaging projections 41 have rectangular shapes.

Figure 9:
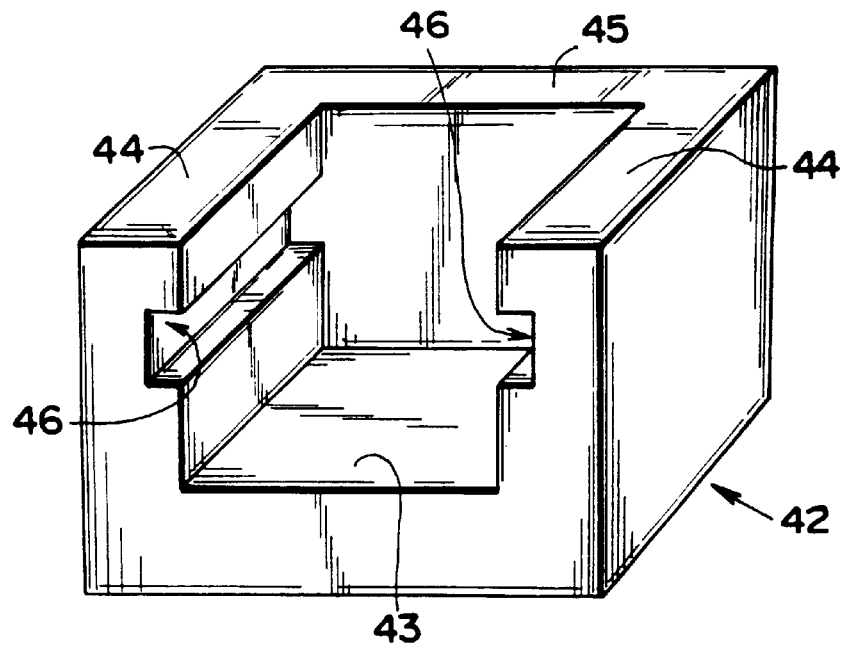
FIG. 9 is a perspective view schematically showing one embodiment of a movable mold for housing and retaining the fin shown in FIG. 7 and the spacer shown in FIG. 8.

FIG. 9 is a schematic diagram showing a movable mold in the diecasting molding mold. The movable mold 42, as shown, is a metallic container constructed to include: a bottom 43 formed to have a flat face; side walls 44 individually raised upright from the right and left edges of the bottom 43 of FIG. 9 and in parallel with each other to confront each other; and a back wall 45 merging into the deep edge portions of the side walls 44 and raised upright from the bottom 43. Here, the back wall 45 is formed to have a flat face.

In the confronting faces of the side walls 44, moreover, there are individually formed engaging grooves 46 which are extended depthwise of FIG. 9 in parallel with the surface of the bottom 43. These engaging grooves 46 are straight ones recessed in a rectangular section from the surfaces of the side walls 44 and are opened outward of the movable mold 42 and at the side opposed to the back wall 45. Here, the side walls 44 and the back wall 45 are at the equal levels, and the gap between the side walls 44 is equal to the width size of the fins 8.

As a result, the sectional shape of the internal space, as defined by the side walls 44 and the bottom 43, is identical to the shape of the spacers 40.

Figure 10:
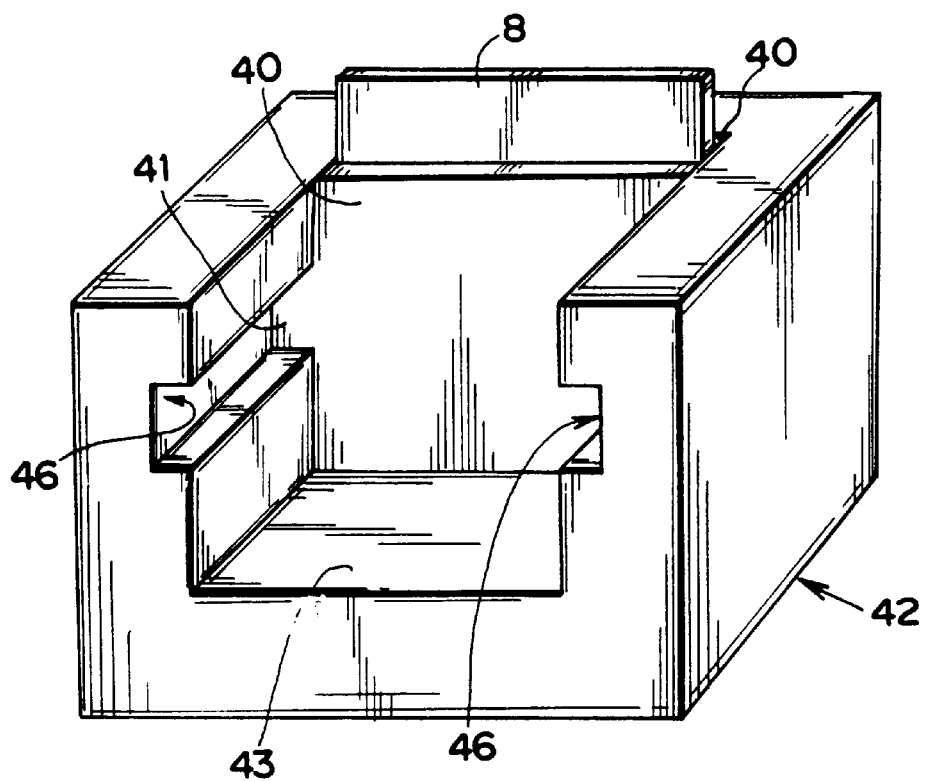
FIG. 10 is a perspective view showing the state in which the fin and the spacer are mounted in the movable mold.

Here will be described the procedure of mounting the fins 8 and the spacers 40 in the movable mold 42. First of all, the engaging projections 41 of the spacer 40 are fitted in the engaging grooves 46 of the movable mold 42 and are slid until they come into abutment against the back wall 45. Next, the fin 8 is arranged in face-to-face contact with the spacer 40 between the side walls 44. From now on, a desired number of fins 8 and spacers 40 are alternately fitted, as described above (as shown in FIG. 10).

In this case, the upper edges of the individual spacers 40 are at the same level as that of the upper edges of the side walls 44 and the back wall 45. On the other hand, the upper edges of the individual fins 8 are so slightly projected from the upper edges of the side walls 44 and the back wall 45 as to provide the penetration depth of the fins 8 into the later-described base.

Moreover, the outer face of the back wall 45 of the movable mold 42 and the side faces of the spacers 40 are damped by a damper 47. As a result, the fins 8 and the spacers 40 are individually damped in the thickness direction so that the three components are fixed altogether.

Next, the base 7 is attached to the fins 8. The movable mold 42 carrying the fins 8 and the spacers 40 is fitted and fixed in the stationary mold 12 to define the cavity 16 between these movable mold 42 and the stationary mold 12. More specifically, the movable mold 42 is held with the end faces of the individual spacers 40 being arranged in parallel to confront the bottom face of the cavity 16. Here, the spacing between the end faces of the spacers 40 and the bottom face of the cavity 16 corresponds to the thickness of the base 7. Moreover, the stationary mold 12 is provided with the injection sleeve 17 for injecting the molten metal 13 of copper (Cu) for the material of the base 7 into the cavity 16, and the plunger 14 for moving back and forth in the injection sleeve 17.

Figure 12:
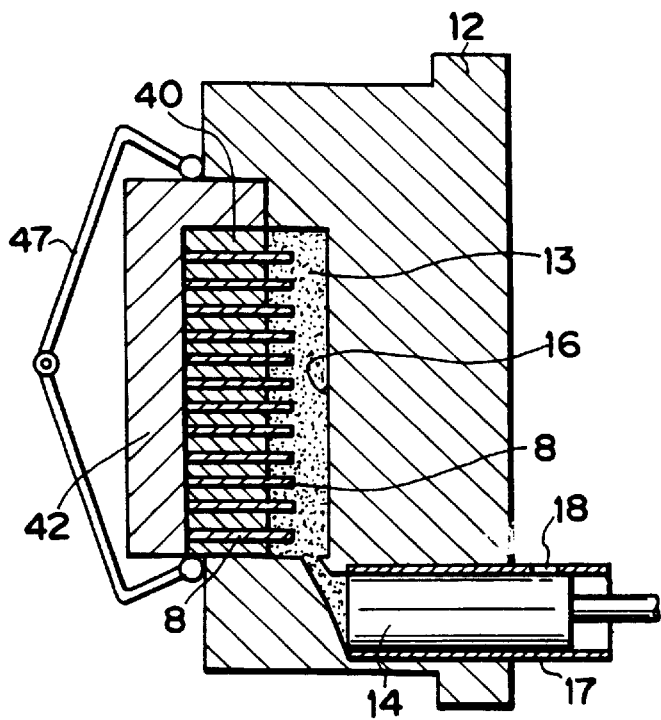
FIG. 12 is a section schematically showing the state in which a molten metal is injected into the cavity.

The plunger 14 is driven toward the movable mold 42, as shown in FIG. 12, to inject the molten metal 13 under a high pressure and at a high speed into the cavity 16. Then, the projected end portions of the individual fins 8 and the end faces of the individual spacers 40 are wetted by the molten metal 13. When the lower end portions of the fins 8 come into contact with the molten copper 13, their surfaces are melted because their material Al has a lower melting point than that of copper. When the materials of the molten metal 13 and the fins 8 solidify, the fins 8 are internally chilled by and integrated with the base 7.

In this case, the clamping force is exerted in the thickness direction of the fins 8 by the damper 47, so that the molten metal 13 does not steal into the clearances between the spacers 40 and the fins 8 and between the spacers 40 and the back wall 45 even if a difference in the coefficient of thermal expansion is between the fins 8 and the spacers 40. Since the edges of the fins 8 and the spacers 40 are held in dose contact with the surfaces of the side walls 44 of the movable mold 42, nor steals the molten metal 13 into the clearances between the edges of the spacers 40 and the fins 8 and the movable mold 42.

Figure 11:
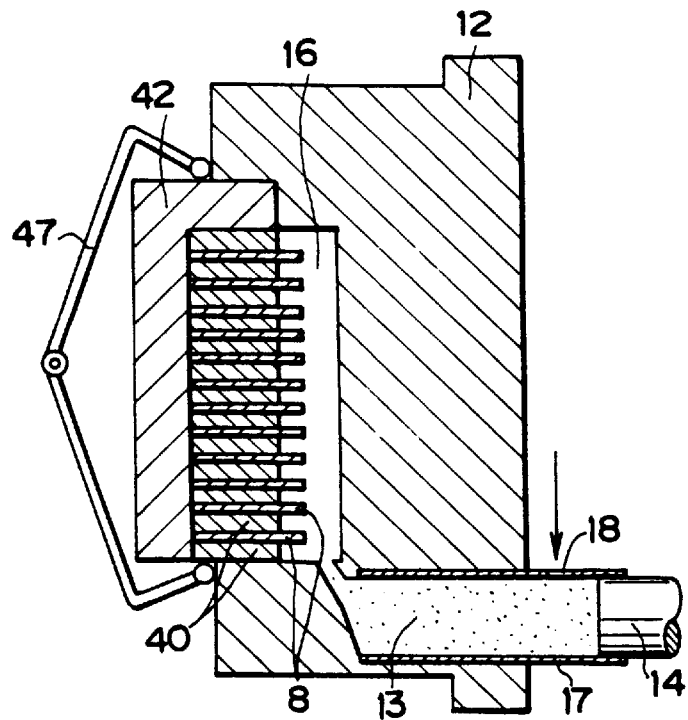
FIG. 11 is a section schematically showing the state in which a base portion is being diecast by employing the movable mold shown in FIGS. 9 and 10.
Figure 13:
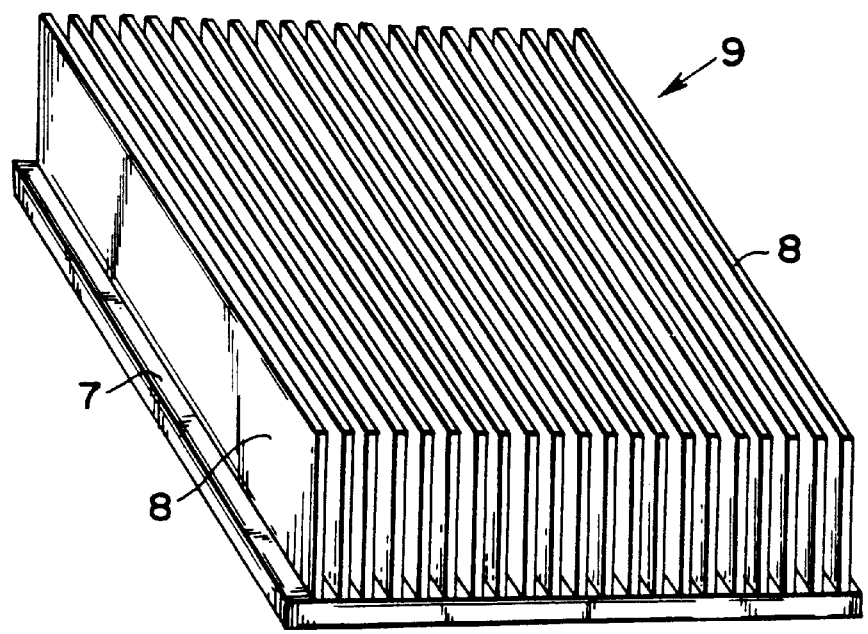
FIG. 13 is a perspective view showing one embodiment manufactured by a process of the invention.

Next, a finished product of the heat sink 9 is taken out of the movable mold 42. Specifically, after the movable mold 42 or the member such as the base 7 has been sufficiently cooled down, the damper 47 is removed, and the base 7 and the movable mold 42 are moved away in the face directions (i.e., to the right and left in FIGS. 11 and 12) of the fins 8 from each other. As described hereinbefore, the engaging projections 41 of the individual spacers 40 are individually fitted in the engaging grooves 46 of the movable mold 42 so that the movements of the spacers 40 in the aforementioned direction are intercepted. As a result, the assembly of the base 7 and the fins 8 is parted from the movable mold 42 while leaving the individual spacers 40 in the movable mold 42. Thus, the fins 8 and the spacers 40, as alternately arrayed, can be separated by the single operation. The heat sink 9 thus manufactured is constructed, as shown in FIG. 13, such that a plurality of fins 8 of Al are arranged at the small pitch to rise generally upright from the upper face of the plate-shaped base 7 of Cu.

Thus, according to the aforementioned specific embodiment, the pitch of the fins 8 can be arbitrarily set by using the spacers 40 made of the existing rolled sheet, and the steal of the molten metal 13 into the clearances between the spacers 40 and the fins 8 and between them and the movable mold 42 can be prevented to manufacture the heat sink 9 having a narrower pitch than that of the prior art simply and reliably. By changing the thickness of the spacers 40, moreover, a plurality of kinds of heat sinks 9 having different pitches can be manufactured by the common movable mold 42 so that the production cost can be lowered as a whole.

Figure 14:
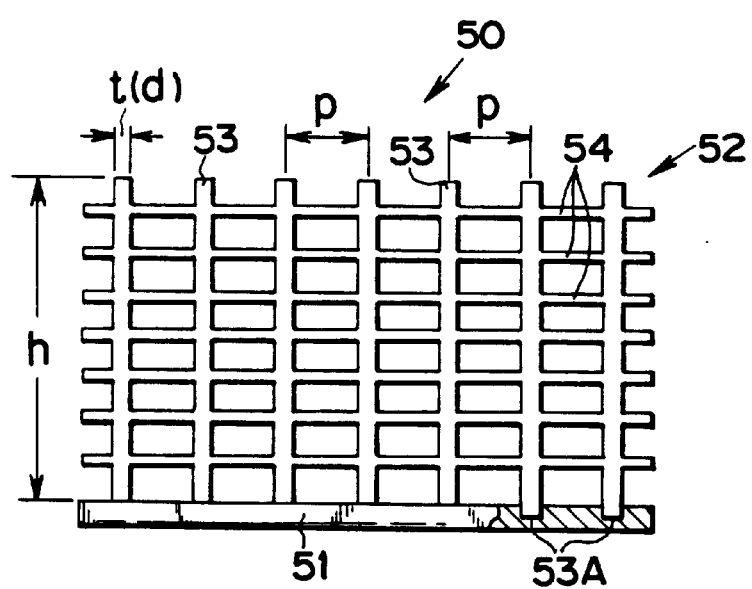
FIG. 14 is a partially cut-away front elevation showing a heat sink according to the invention and employing a fin providing with portions erected from the base portion and portions connecting the erected portions.

Another embodiment of the heat sink according to the invention is shown in FIG. 14. A heat sink 50 shown in FIG. 14 is equipped with a plate-shaped base plate 51 formed into a generally square top plan shape, and a plurality of radiation fins 52 erected from the surface of the base plate 51. The base plate 51 and the radiation fins 52 are made of a common metallic material such as aluminum or copper having an excellent thermal conductivity.

Moreover, the radiation fins 52 are composed of a plurality of first radiation fins 53 erected generally upright from the base plate 51, and second radiation fins 54 arranged generally at a right angle with respect to the first radiation fins 53. In short, the first radiation fins 53 and the second radiation fins 54 are assembled in a lattice shape. These first and second radiation fins 53 and 54 may be molded into a sheet or circular column. In this case, the second radiation fins 54 are set to have a smaller thickness or external diameter than the thickness t or external diameter d of the first radiation fins 53. Moreover, the roots 53A of the first radiation fins 53 are buried in the base plate 51.

Moreover, the first radiation fins 53 are set to have a substantially constant height h, a substantially constant thickness t and a substantially constant external diameter d. Then, these height h and thickness t or external diameter d are so set that the ratio C determined by h/t or h/d may be at "40" or more. Here, the remaining constructions are similar to those shown in FIG. 1.

Here will be described a process for manufacturing the heat sink 50. At first, the first radiation fins 53 and the second radiation fins 54 are separately rolled or extruded and are then subjected to a predetermined machining treatment or the like. After this, the first radiation fins 53 and the second radiation fins 54 are assembled into the radiation fins 52. Then, the base plate 51 is integrated with the radiation fins 52 by the diecasting method to complete the heat sink 50.

This heat sink 50 can also achieve effects similar to those of the heat sinks of the foregoing individual embodiments. According to the heat sink 50, moreover, the radiation fins 52 are constructed by combining the first radiation fins 53 and the second radiation fins 54 in the lattice shape so that the radiation area is far more increased than those of the heat sinks of the foregoing embodiments thereby to improve the radiation efficiency better. Still moreover, the first radiation fins 53 and the second radiation fins 54 are combined in the lattice shape to reinforce their strengths in the thickness directions so that the radiation fins 52 will not become short of strength even if they are thinned.

As described hereinbefore, the process for manufacturing the heat sink according to the invention integrates the base with the existing fins by diecasting the base with the one-end portions of the fins. As a result, the fins can be made thinner with respect to their height and reduced in their array pitch. On the other hand, the rigidity of the fins themselves may become lower, and the strength may also become lower due to the thermal influence at the base casting time. In the invention, therefore, the fins may be subjected to the following treatments.

Figure 15:
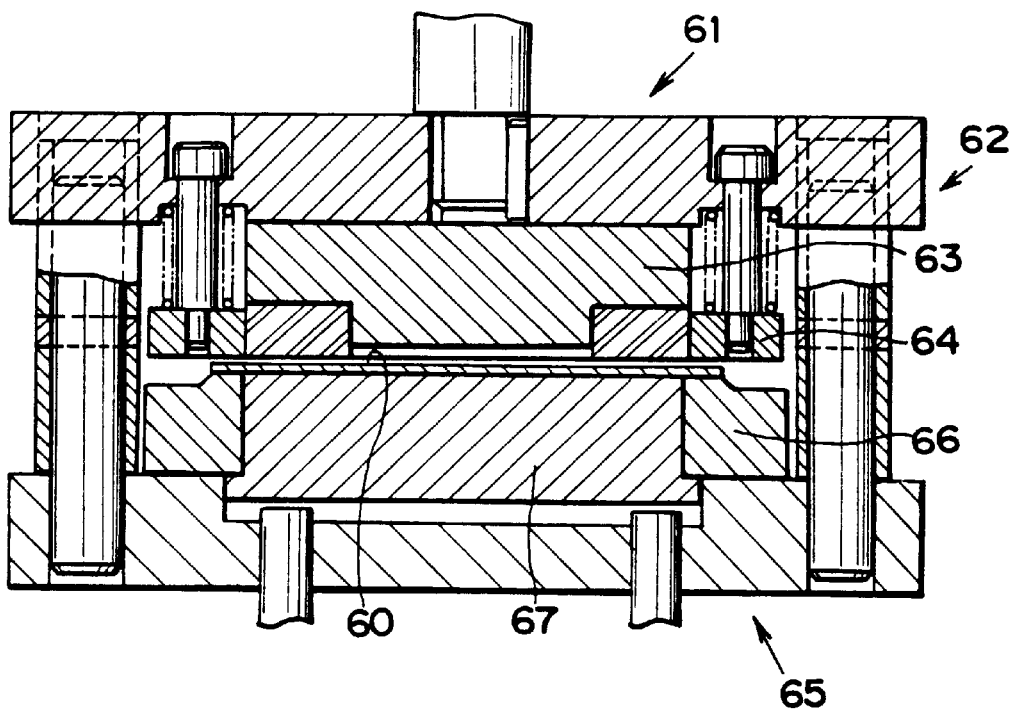
FIG. 15 is a section showing an apparatus for pressurizing and compressing a flat fin in the thick direction thereof.
Figure 16:
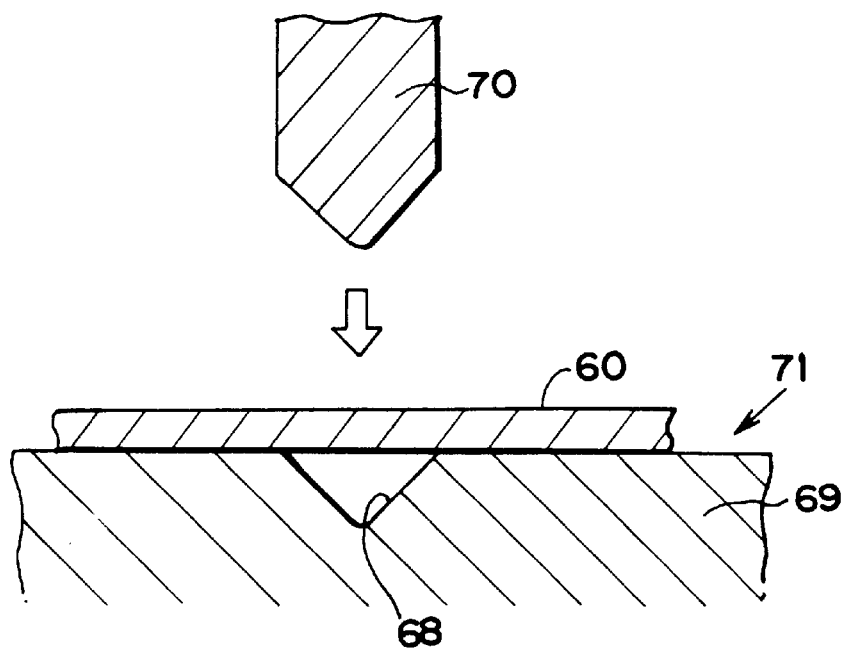
FIG. 16 is a section showing a mechanism for forming projections on the flat fin.
Figure 17:
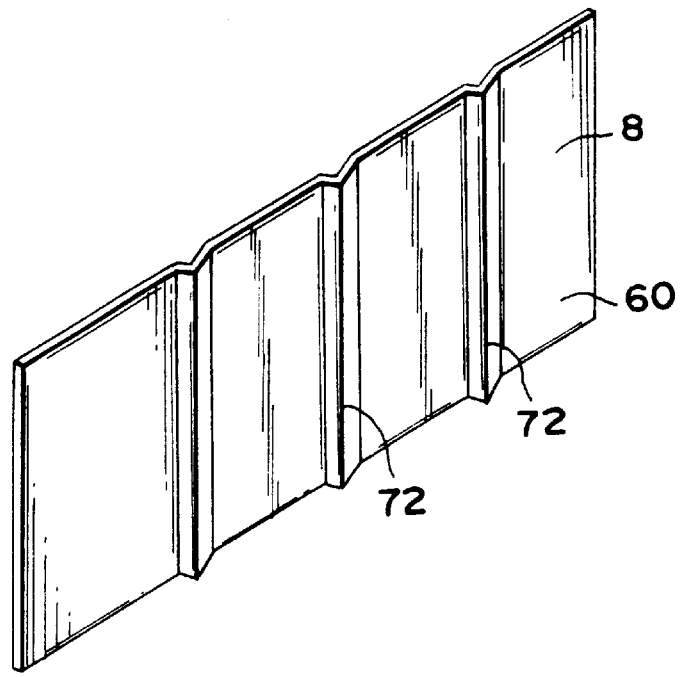
FIG. 17 is a perspective view showing a fin having V-shaped projections.

In an embodiment shown in FIGS. 15 to 17, the rigidity is improved by reforming the metallic structure, and the bending strength is improved by means of ribs. As the material for the fins to be used in this process, there is prepared a flat-shaped rolled sheet 60 made of Al or its alloy. In this specific embodiment, the rolled sheet 60 to be prepared is slightly larger than the fin to be formed because the blanking treatment is adopted.

At first, the rolled sheet 60 is set in an outline blanking die 61 so that it is blanked out into a rectangular or square shape, as shown in FIG. 15. This outline blanking die 61 is equipped at its top part 62 with a punch 63 and a movable stripper 64 and at its bottom part 65 with a die 66 and a movable pad 67 (or a knockout 67) having a cushion. As a result, the rolled sheet 60 is blanked out such that it is held internally and externally by a strong force immediately before it is blanked out.

In this case, the rolled sheet 60, as blanked and taken out, is compressed in the thickness direction by the punch 63 and the knockout 67 so that it is thinned by about 0.2 to 10% from the original thickness. By this compression in the thickness direction, the internal segregations or voids disappear or decrease so that the strength of the rolled sheet 60 is improved.

Next, projections or ridges (acting as the reinforcing ribs) are formed on the thinned rolled sheet 60. This treatment can be performed by a V-grooved mold 71 which is constructed to include a die 69 having straight V-shaped grooves 68 in its upper face, and a punch 70 having a tip shaped to correspond to the groove 68. Specifically, the rolled sheet 60 is so arranged and held on the upper face of the die 69 that the lines of the straight grooves 68 and the edges of the rolled sheet 60 are at a right angle or in parallel. As shown in FIG. 17, when the punch 70 is moved downward from that state, ridges 72 rising to have a V-shaped section are formed to extend from the upper edge to the lower edge of one face of the rolled sheet 60.

Moreover, three ridges 72 are formed on each rolled sheet 60. In this case, these ridges 72 are arranged in parallel with one another at an equal gap. Thus, the fins 8 are completed.

The process for manufacturing the heat sink 9 by employing these fins 8 is identical to that described with reference to FIGS. 2 and 3.

Figure 18:
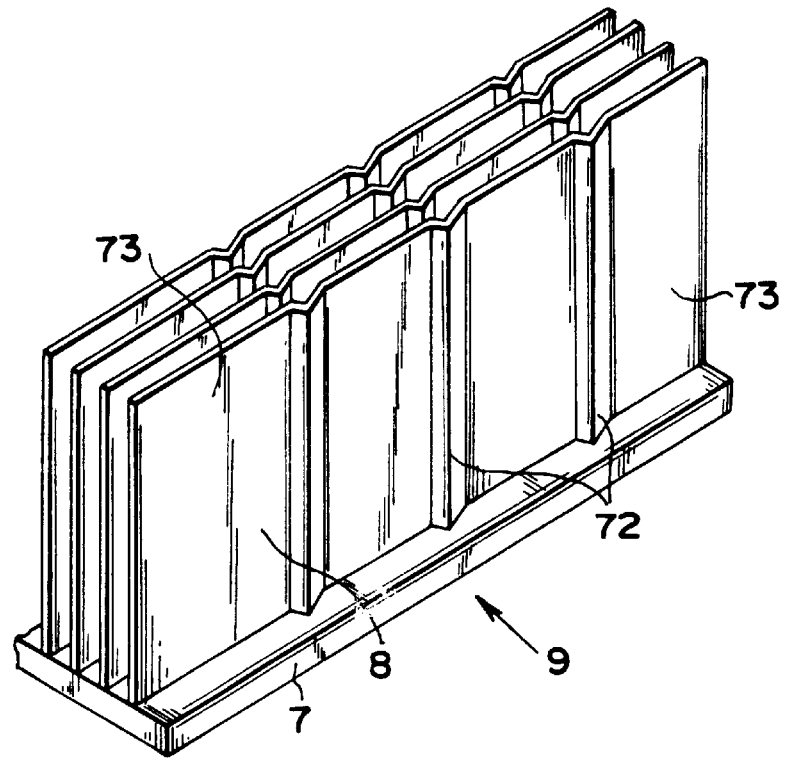
FIG. 18 is a perspective view of a heat sink employing the fins having the projections.
Figure 19:
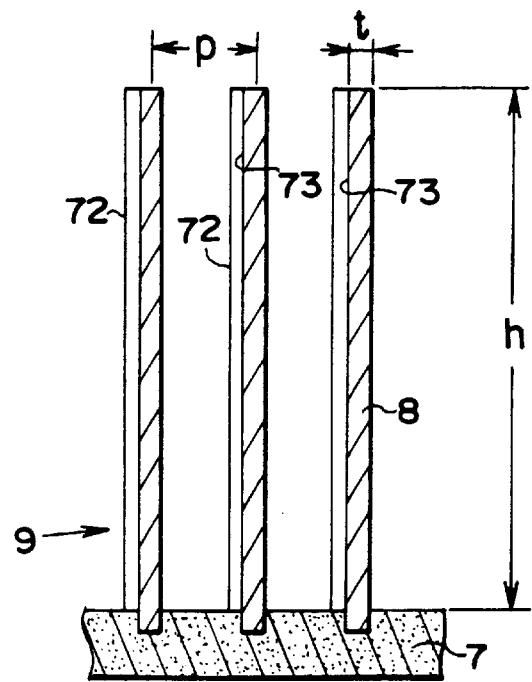
FIG. 19 is a section showing a portion of the heat sink.

The heat sink 9 thus manufactured will be described with reference to FIGS. 18 and 19. The fins 8 are mounted to extend upward from the upper face of the base 7, as seen from FIG. 18, so that these base 7 and fins 8 construct the heat sink 9. The base 7 is exemplified by a generally square or rectangular flat sheet having a thickness of about 3 mm.

On the other hand, the fins 8 are formed into a rectangular shape having a height (h) of 20 mm. The ridges 72 are formed to extend from the upper edges to the lower edges of the surfaces of the fins 8 at this side of FIG. 18. Moreover, the ridges 72 are formed on three lines of an equal spacing, as taken in the obliquely horizontal direction of FIG. 18, i.e., in the longitudinal direction of the fins 8.

On the other hand, the portions of each fin 8 other than the ridges 72 are formed as flat portions 73 having flat faces, which are formed at four positions in each fin 8 of this embodiment. Here, the thickness (t) of those flat portions 73 is exemplified by 0.5 mm. As shown in FIG. 19, therefore, the ratio (C) of the height (h) of the fins 8 to the thickness (t) of the flat portions 73 is $C = h/t = 20/0.5 = 40$.

According to the heat sink 9 thus constructed, the fins 8 are increased in the geometrical moment of inertia of their sections by the ridges 72 so that their folding or bending deformation can be prevented without fail. Here, the process adopted is to mount the fins 8 of the rolled sheet 60 on the base 7 by the diecasting method so that the fins 8 can be made thin and high. Moreover, the pitch (p) can be reduced to enlarge the heat exchanging area as a whole. As a result, it is possible to provide the heat sink 9 which is strong in the construction and large in the heat exchanging area.

Moreover, the heat sink 9 does not have the construction in which the ridges 72 are too close to the adjoining fins 8. Thus, when fins 8 are ventilated with air by a cooling fan, for example, the air flow flows so smoothly that the heat sink 9 can have an excellent radiation.

Figure 20:
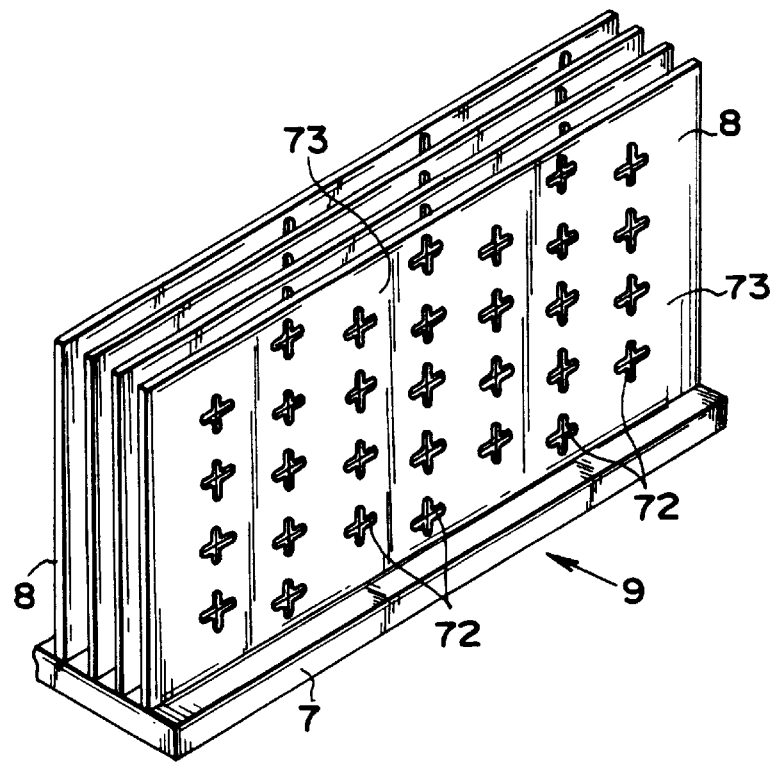
FIG. 20 is a perspective view of a heat sink equipped with fins having cross-shaped projections.

Here, the projections 72 to be formed on the fins in the invention should not be limited to the ridges having the V-shaped sections extending in the vertical direction of the fins but may be exemplified by cross-shaped projections, as shown in FIG. 20. These cross-shaped projections 72 can be prepared by the embossing treatment.

For the fins 8 having the cross-shaped projections 72 shown in FIG. 20, the thickness size is increased at the portions of the projections 72 so that the geometrical moment of inertia in the section is increased to improve the bending strength of the fins 8. As a result, the fins 8 can maintain their strength to prevent their deformation even after the base 7 is formed by the diecasting method.

Here will be described a method of reforming the fins 8 after the base 7 was formed by the diecasting method. One example of this reforming method is a heat treatment. The heat sink 9, as prepared by integrating the base 7 with the one-end portions of the prepared fins 8 by the diecasting method, is placed in a not-shown electric furnace so that it is homogeneously heated in a vacuum atmosphere. The heat sink 9 thus heated is quenched by dipping it in an oil bath. This quenching rate has to be higher than the critical cooling rate which is intrinsic to the material used for the heat sink 9. After this quenching, the heat sink 9 is annealed, if necessary.

The fins 8 are heated and annealed at the time of casting the base 7 so that their strength is once lowered. By the aforementioned heat treatment, however, the structure is refined to improve its strength. As a result, the fins 8 are hardly deformed by the external force. Specifically, after the diecasting of the base 7, at least the fins 8 are subjected to the heat treatment to refine their metallic structure so that the heat sink 9 can be manufactured to have the rigid structure and the wide heat exchanging area.

Figure 21:
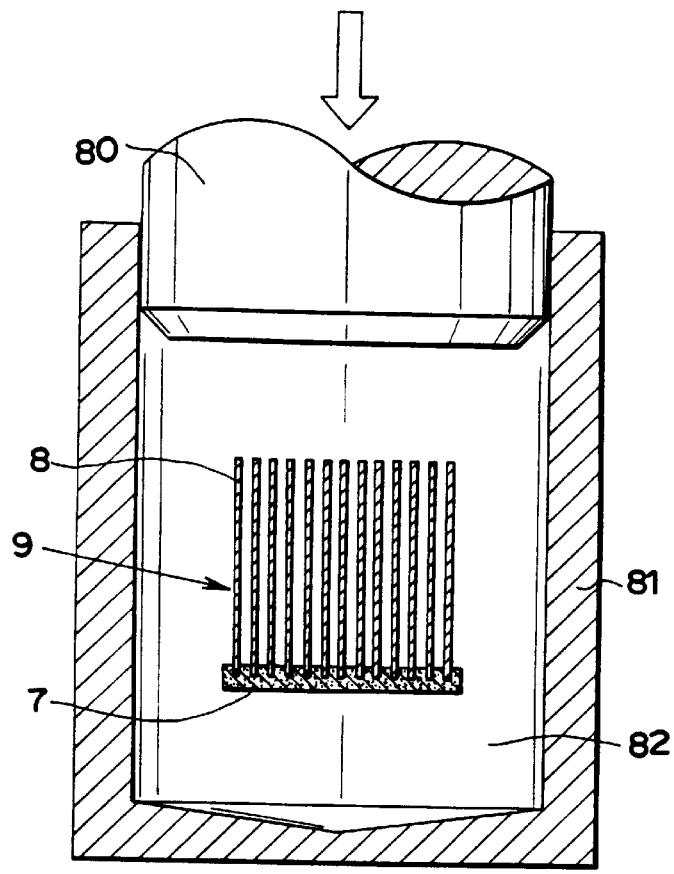
FIG. 21 is a section for explaining a step of pressurizing fins after the casting of a base portion.

Another example of reforming the fins 8 is to improve the strength by a hardening treatment, as exemplified in FIG. 21. The heat sink 9, as constructed by integrating the base 7 with the one-end portions of the fins 8 by the diecasting method, is dipped in a pressurizing liquid to pressurize the fins 8. Specifically, there is provided a container 81 capable of fitting a cylindrical ram 80 closely from the upper side of FIG. 21, and the container 81 is filled up with working oil 82 functioning as the pressurizing liquid.

The heat sink 9 is dipped in the working oil 82, and the ram 80 is inserted into the container 81 to pressurize the working oil 82 downward of FIG. 21. The pressure is exemplified by about 5.0 to 50 Kgf/cm$^2$. After this pressurization, the heat sink 9 is taken out of the container 81 and is cleared of the working oil 82 by a rinsing operation until it is dried.

By pressurizing the fins 8 through the working oil 82, the oil pressure can be homogeneously applied in the thickness direction to the thin fins 8 so that the fins 8 are not deformed while being pressurized. Moreover, the fins 8 are hardened to improve their strength by the pressurization. As a result, the fins 8 can be prevented from being deformed, to provide the heat sink 9 having the strong construction and the wide heat exchanging area.

As known from the embodiments thus far described, in short, the heat sink and its manufacturing process of the invention have a major object to make the radiation area larger than that of the prior art. The heat sink to be descried in the following is subjected to an aftertreatment for enlarging the surface area of the fins. Specifically, the fins are coated on their surfaces with fine particles.

Figure 3:
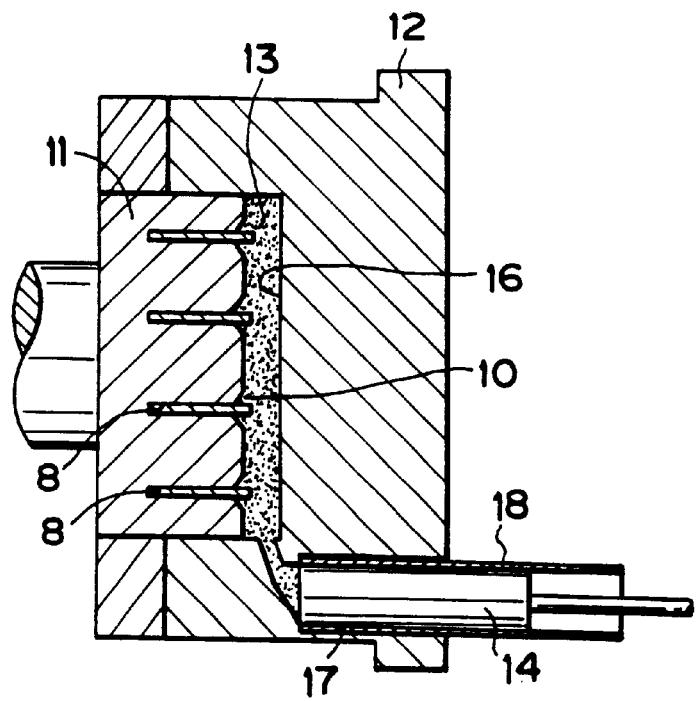
FIG. 3 is a section schematically showing the state in which a molten metal is injected into a cavity of the heat sink manufacturing apparatus according to the invention.
Figure 24:
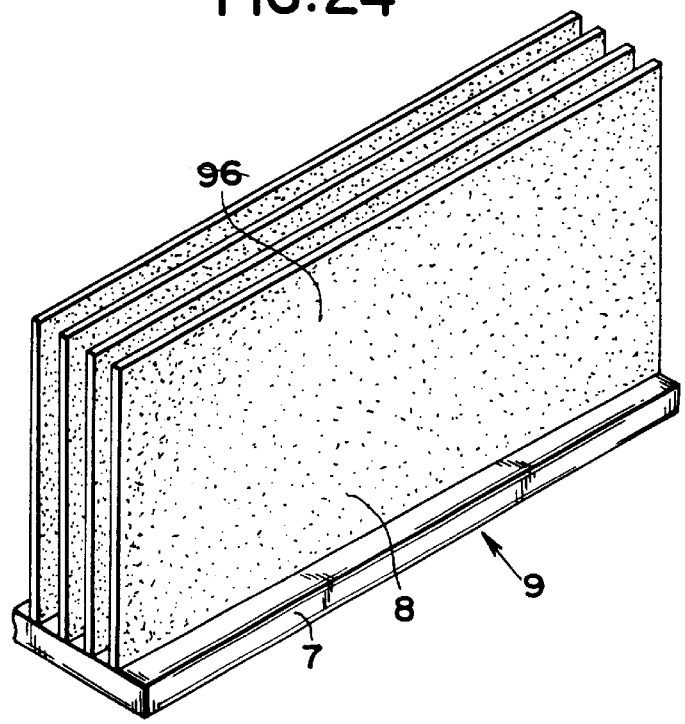
FIG. 24 is a perspective view showing one example of a heat sink having the fins to which the fine particles are adhered.
Figure 22:
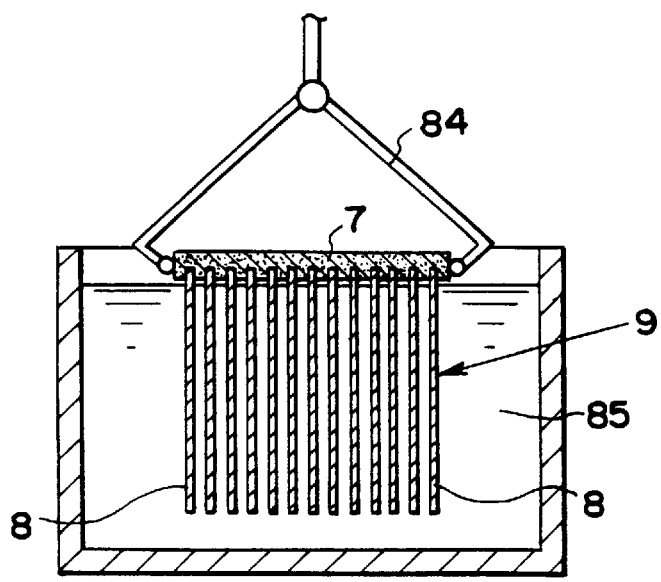
FIG. 22 is a section showing one example of a step of applying an adhesive to the fins.
Figure 23:
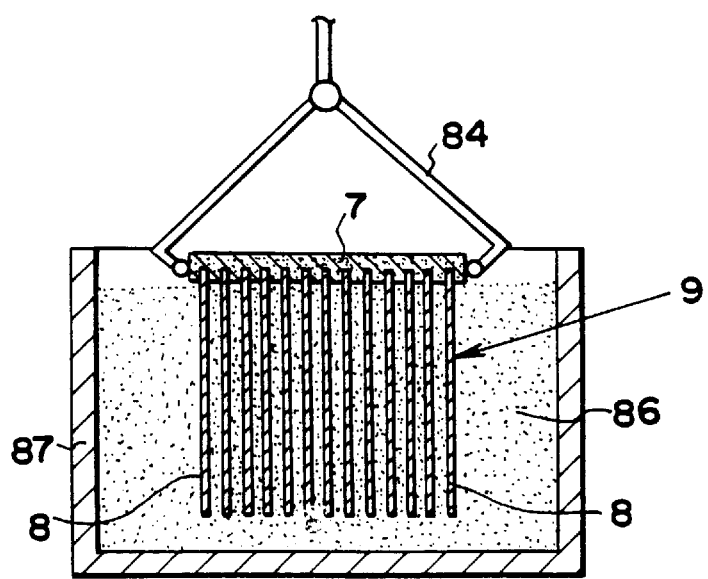
FIG. 23 is a section showing one example of a step of adhering fine particles to the fins.

In FIGS. 22 to 24, the heat sink 9 is prepared by the aforementioned process of FIGS. 2 and 3 so that it is not equipped with the aforementioned support ridges 10 or anchoring portions 15. The fins 8 of the heat sink 9 are subjected to a pretreatment for clearing their surfaces of substances detrimental to adhesions. After this pretreatment, the fins 8 are dipped in an adhesive 85 while the heat sink 9 being supported by a chuck 84, as shown in FIG. 22. The adhesive, as used, has both a heat resistance and a thermal conductivity.

As shown in FIG. 23, moreover, the heat sink 9, after having been dipped in the adhesive liquid, is so inserted, while being supported by the chuck 84, into a container 87 containing fine particles 86 that the surfaces of the fins 8 may be coated with the fine particles 86. The fine particles 86, as used herein, are those of Al or alumina ($Al_2O_3$) having a particle diameter of 100 to 500 microns. Moreover, the container 87 is so oscillated to the right and left of FIG. 23 that the fins 8 may be coated with the fine particles 86 all over their surfaces. In order to complete the coating, the heat sink 9 is subjected to a drying treatment or the like.

FIG. 24 shows the heat sink 9 having the fins 8 coated with the fine particles 86 on their surfaces. Since the fins 8 are thus coated with the fine particles 86, their surface areas to be exposed to the atmosphere can be increased to raise their heat transfer efficiency.

Here, the foregoing individual specific embodiments are exemplified by the plate-shaped fins, but the invention should not be limited thereto but may be exemplified by corrugated sheet fins. Moreover, the material for the fins should not be limited to the rolled sheet but can adopt the circular columns which are machined or cast. Still moreover, the material for the fins or base is exemplified by Cu or Al, but the invention should not be limited thereto but can adopt graphite or magnesium.

On the other hand, the heat treatment of the fins in the invention is performed to improve the strength by refining the structure of the fins. Therefore, the heating and cooling methods should not be limited to those of the aforementioned embodiments but may be exemplified by a surface hardening heat treatment such as the induction hardening or flame hardening method.

Moreover, the reason why the fins are pressurized in the invention is to improve the strength by the hardening. Therefore, the pressurizing means can adopt not only the aforementioned pressurization by the oil pressure but also the method by a water pressure or the method using the a press mold.

Moreover, the coating with the fine particles in the invention is performed to increase the surface areas of the fins. In addition to the aforementioned specific embodiment, therefore, the surface areas of the fins may be increased by roughing the surfaces of the fins by the blasting treatment, the etching treatment or the machining treatment.

Figure 25:
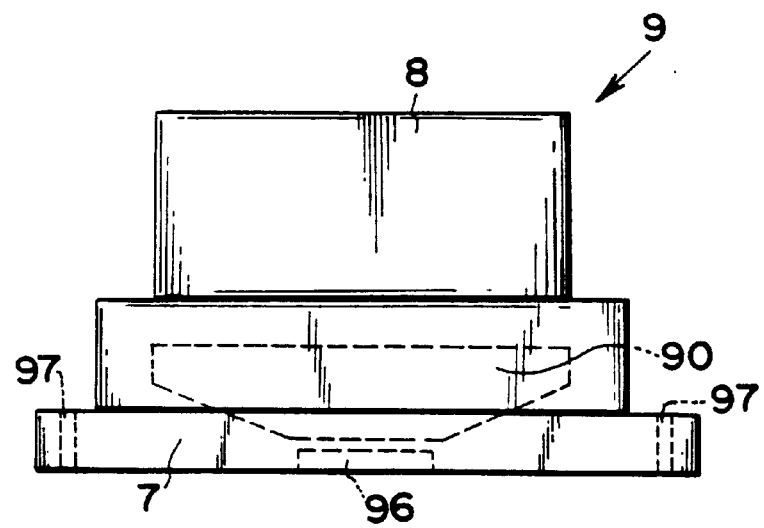
FIG. 25 is a front elevation showing a heat sink having a heat pipe mounted in the base.
Figure 26:
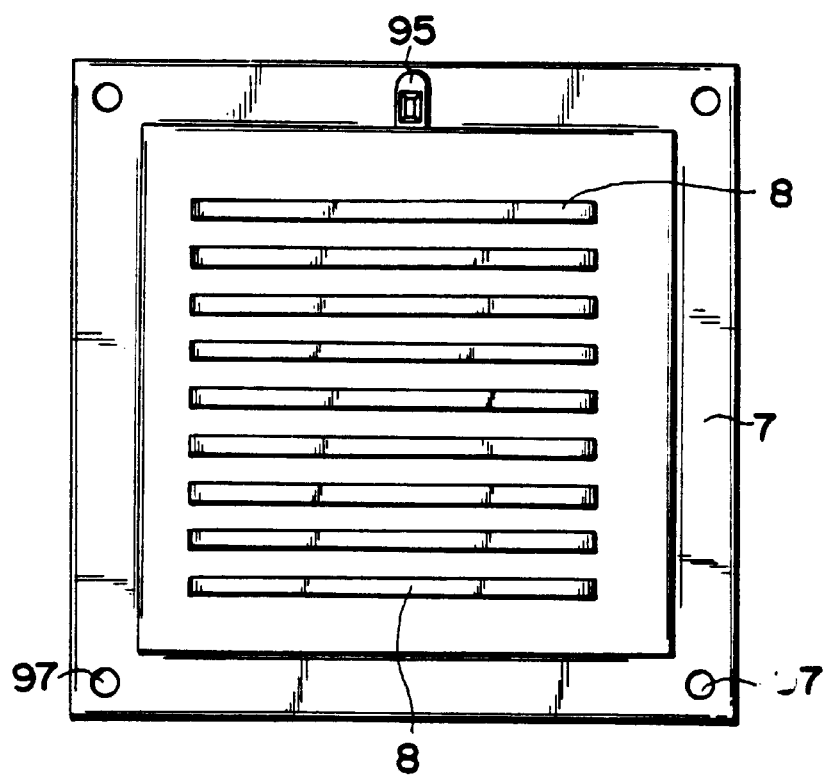
FIG. 26 is a top plan view of a heat sink having the heat pipe mounted in the base.
Figure 27:
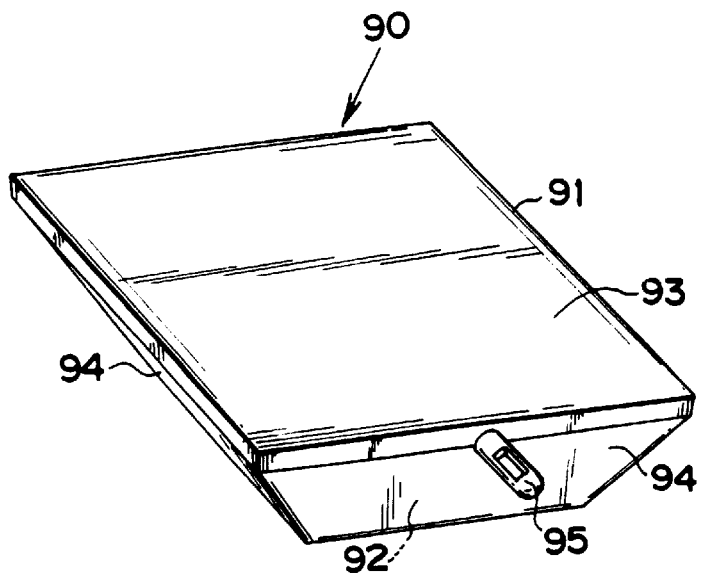
FIG. 27 is a perspective view showing one example of the heat pipe.

The aforementioned base 7 of the solid structure can be replaced by a base of a hollow structure having a heat pipe, as will be described in the following. The base 7 of the heat sink 9 shown in FIG. 25 is made thick to have a flattened heat pipe 90 built therein. This heat pipe 90 has a container 91 having a shape of hollow and low frustum of quadrangular pyramid, as shown in FIG. 27. This container 91 is a sealed one of copper, which is composed of: a square bottom plate 92; a top plate 93 having a larger square shape than the bottom plate 92 and confronting the bottom plate 92 in parallel; and four sloped side walls 94 and joining the corresponding four sides of the top plate 93 and the four sides of the bottom plate 92. In the container 91, there is sealed (not-shown) pure water acting as the working fluid in an evacuated state to provide the heat pipe.

To the container 91, on the other hand, there is connected an injection nozzle 95 which is in communication with the inside of the container 91. This injection nozzle 95 adopts a thin tube of a circular section made of the same material as that of the container 91. The end portion, as projected from the container 91, of the injection nozzle 95 is radially pressed and sealed up.

The heat pipe 90 thus constructed is buried in the central portion of the base 7 of thin rectangular prism. Here, the injection nozzle 95 is projected to the outside of the base 7. In the central portion of the lower face of this base 7, there is formed a recess 96 which is shaped to profile the (not-shown) central processing unit to be cooled. At the lower face sides of the base 7, moreover, there are formed outwardly extending flanges, the four corners of which are threaded at 97 for fixing the base 7 on the (not-shown) printed wiring board.

From the upper face of the base 7, on the other hand, there are erected the fins 8 which are made of flat sheets of aluminum and which are arranged in parallel with one another. Here, the lower edges of the fins 8, as seen from FIG. 25, are extended through the upper face of the base 7 to contact with the top plate 93 of the container 91.

When the heat sink 9 thus constructed is to be employed for cooling the central processing unit of a personal computer, the central processing unit, as fixed on the printed wiring board, is fitted in the aforementioned recess 96, and the base 7 is fixed on the printed wiring board by driving (not-shown) screws into the threaded holes 97.

The process for manufacturing the heat sink 9 thus constructed will be described with reference to FIG. 22. At first, the container 91 carrying the injection nozzle 95 is prepared and is integrated with the fins 8. Specifically, the container 91 is set in such a position in the internal space of a stationary mold 98 that the bottom plate 92 is directed rightward of FIG. 28.

On the other hand, the fins 8 are held at their upper edges and intermediate portions in a stationary core 99 while being arrayed in parallel with one another. Then, the stationary core 99 is set in a movable mold 100 by suitable means. In this case, the stationary core 99 is arranged such that the lower edges of the individual fins 8 are protruded from the bottom face of the stationary core 99 into the internal space of the movable mold 100 and held in contact with the upper face of the top plate 93 of the container 91.

As a result, a space (or cavity) profiling the base 7 is defined by the stationary mold 98 and the stationary core 99. On the other hand, the stationary mold 98 is equipped with the plunger 14 which is constructed to force the molten metal 13 of Al or its alloy as the material for the base 7 from the righthand side to the lefthand side of FIG. 28.

Figure 28:
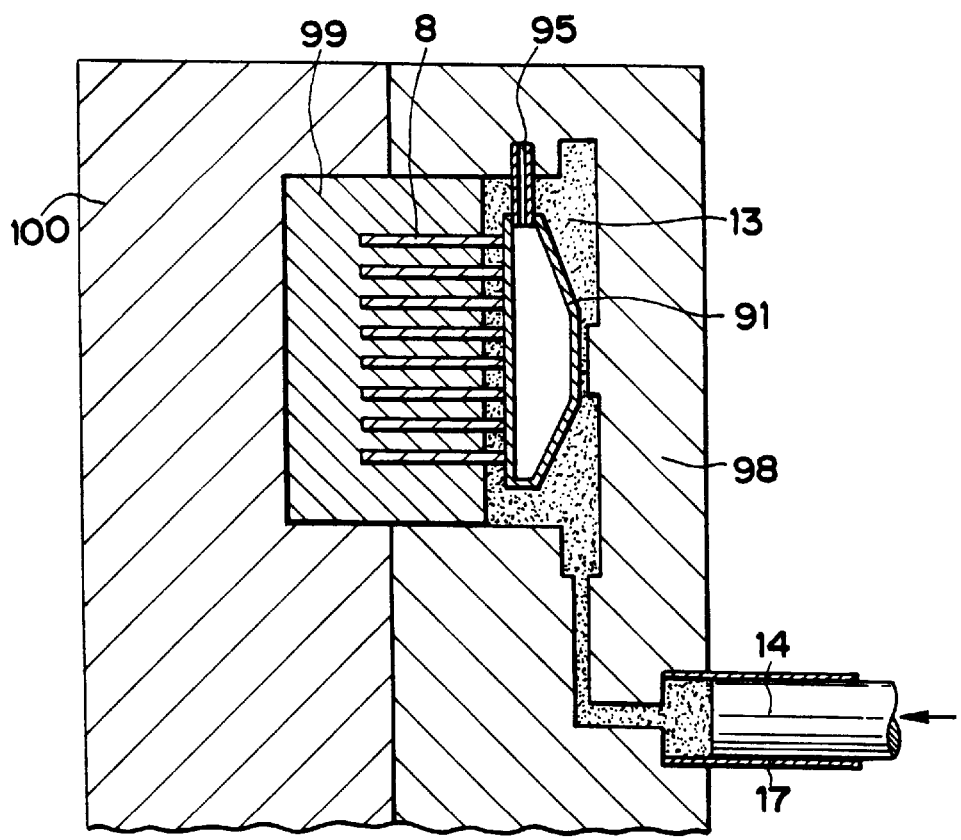
FIG. 28 is a section for explaining a base diecasting step in the process for manufacturing the heat sink shown in FIG. 25.

From this state, the plunger 14 is moved in the direction of arrow of FIG. 28 to apply the pressure to the molten metal 13. Then, all the area of the outer circumference of the container 91 and the root of the injection nozzle 95 are wetted by the molten metal. Moreover, the lower edges of the individual fins 8 are confined by the molten metal 13. This state is left as it is for a predetermined time period to solidify the molten metal 13. Thus, the container 91 and the lower edges of the individual fins 8 are cast integrally with the base 7 of Al or its alloy so that these three components are jointed to one another.

At the aforementioned diecasting time, the container 91 is not sealed so that the internal pressure of the container 91 is not raised by the heat of the molten metal 13 to prevent the deformation or breakage of the container 91.

Next, the container 91 having the fins 8 is changed into the heat pipe. At first, the (not-shown) pure water acting as the working fluid is poured more than a specified amount into the container 91 through the injection nozzle 95. This injection is to subsequently expel the non-condensive gas from the inside of the container 91. At this thermal expelling step, for example, the container 91 is set in a heating furnace or an oil bath (although neither of them is shown) with the injection nozzle 95 being directed upward and is heated at about 120° C.

Then, both the non-condensive gas in the container 91 or the non-condensive gas, as dissolved in the working fluid, are released together with the vapor of the working fluid from the port of the injection nozzle 95 to the outside of the container 91. In short, the difference of the amount of the working fluid, as expelled as the vapor, from the total of the working fluid injected into the container 91 is the substantial amount of the working fluid confined.

Moreover, after the vapor was expelled in the predetermined amount, the injection nozzle 95 is sealed up by squeezing its tip. As a result, the heat pipe 90 is sufficiently degassed at its container 91 itself. At the thermal expelling step, there can be adopted a method in which the internal pressure of the container 91 is raised with the injection nozzle 95 being temporarily fastened in advance and in which the temporarily fastened portion is then released to flush the working fluid. Moreover, the threaded holes 97 are formed at the four corners of the base 7 by means of a drill. After this, the cleaning and inspecting steps or the like are performed as customary. By the procedure thus far described, it is possible to provide the heat sink 9 in which the fins 8 and the heat pipe 90 are firmly jointed.

Thus, according to the specific embodiment described above, the construction having the heat pipe 90 built in the base 7 makes it possible to improve the substantial heat conductivity of the base 7 thereby to easily manufacture the heat sink 9 having a low heat resistance.

Here, the aforementioned specific embodiment is exemplified by the container having the frustum of quadrangular pyramid and the sheet-shaped fins. However, the invention should not be limited thereto but can cover a container having an existing circular section and fins having a ring or column shape.

Moreover, the specific embodiment is constructed such that the outer circumference of the heat pipe is covered with the base having the recess. However, the base is sufficient if it casts the fins and the heat pipe, but need not cover the entire area of the heat pipe. Here, the recess may be formed, if necessary.

Figure 29:
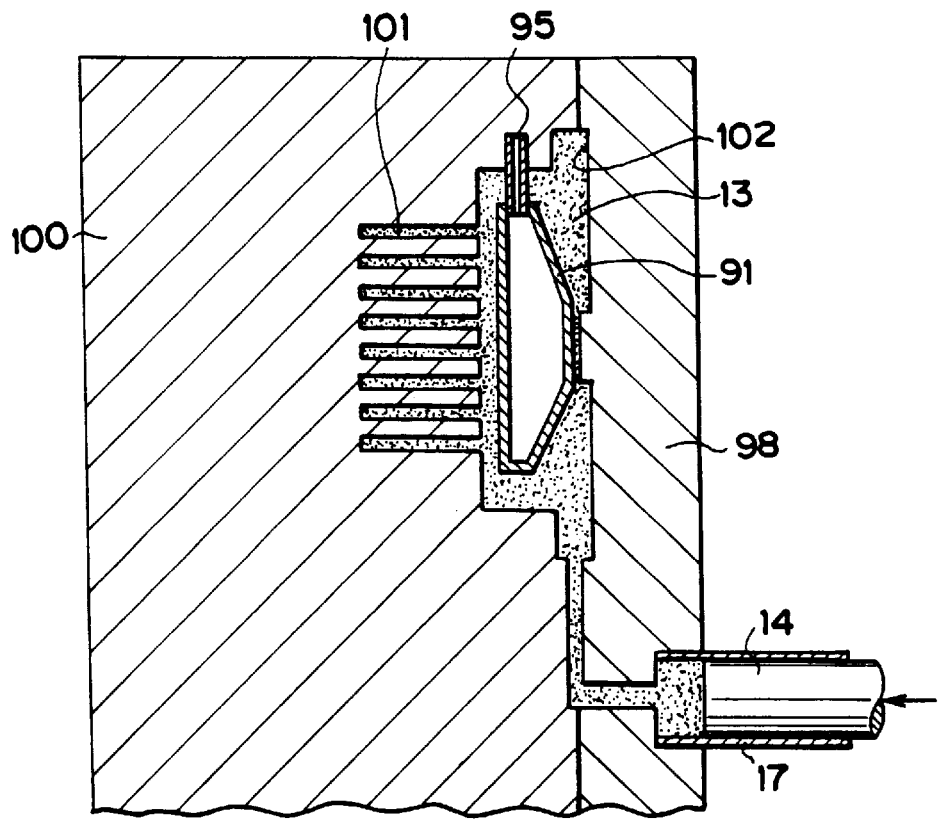
FIG. 29 is a diagram for explaining an example in which the fins are diecast simultaneously as the heat pipe is mounted in the base.
Figure 30A:
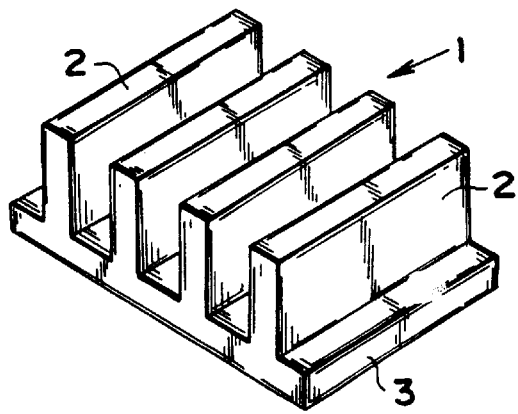
FIG. 30A is a perspective view showing one example of the heat sink, as equipped with plate fins, of the prior art.
Figure 30B:
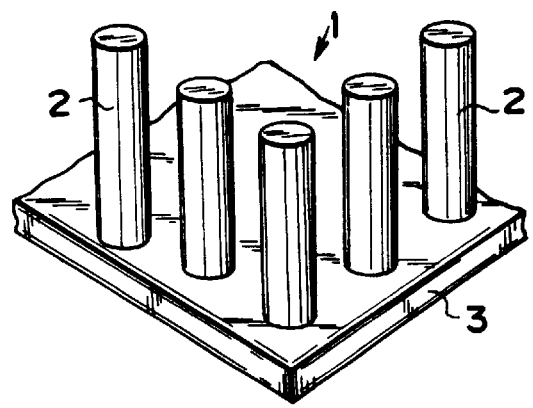
FIG. 30B is a perspective view showing a portion of one example of the heat sink, as equipped with circular column fins, of the prior art.
Figure 31:
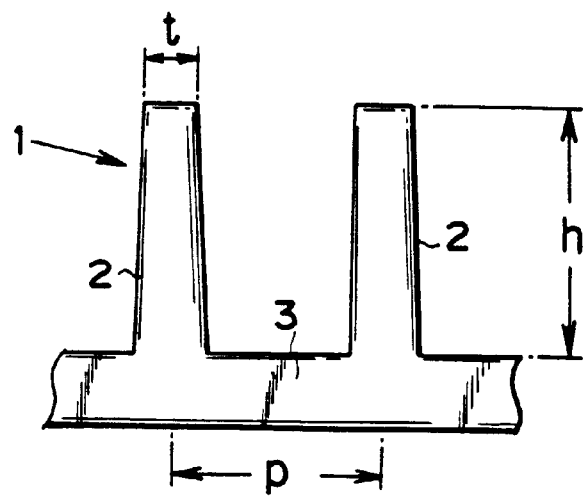
FIG. 31 is a front elevation showing a portion of the heat sink disclosed in Japanese Patent Laid-Open No. 9-181231.
Figure 32:
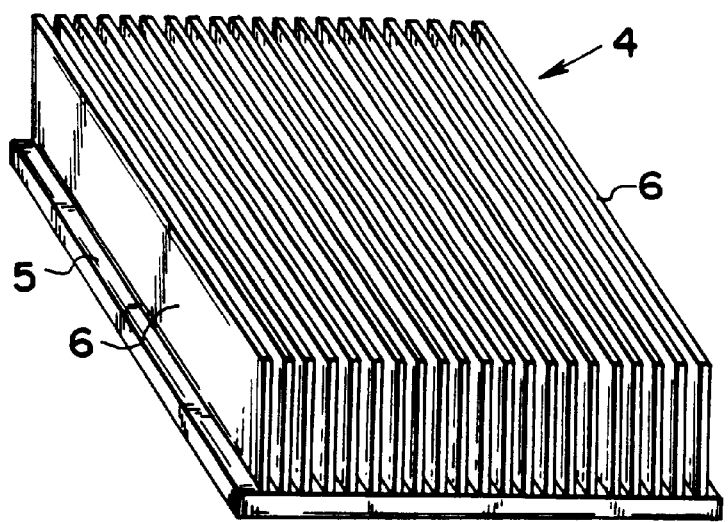
FIG. 32 is a perspective view schematically showing the heat sink disclosed in Japanese Patent Laid-Open No. 9-181231.

When the heat pipe 90 is built in the base 7, the fins 8 may be diecast, as shown in FIG. 29. In a movable mold 100, there are formed a number of slits 101 which are in communication with a cavity 102 for molding the fins 8. Moreover, the cavity 102 is defined between the movable mold 100 and the stationary mold 98 by the so-called "jointing" to hold the movable mold 100 closely on the stationary mold 98. The container 91 for the heat pipe is arranged in the cavity 102, and the molten metal is poured.

As a result, the container 91 is cast with the molten metal 13 for the base. Simultaneously with this, the molten metal 13 steals into the slits 101 and solidifies therein to form the fins. Thus, the container 91 is changed according to a procedure similar to the aforementioned one into the heat pipe by injecting the working fluid from the injection nozzle 95 and confining it in the container 91 buried in the base.

In the heat sink thus manufactured by the process shown in FIG. 29, too, the base and the fins are integrated, and the heat pipe is built in the base so that the heat sink can be given a low heat resistance.

What is claimed is:

1. A process for manufacturing a heat sink having a plurality of radiation fins erected from a plate-shaped base portion, comprising the steps of:

arraying said radiation fins at a predetermined pitch and in parallel with one another and inserting one-end portions of said radiation fins into a cavity of a diecasting mold while holding the one-end portions of the radiation fins liquid-tight;

diecasting said base portion by injecting a molten metal under a predetermined pressure and at a predetermined speed into said cavity, and integrating said radiation fins with said base portion; and pressurizing and compressing said radiation fins in their thickness direction before said base portion is diecast.

2. A process for manufacturing a heat sink having a plurality of radiation fins erected from a plate-shaped base portion, comprising the steps of:

arraying said radiation fins at a predetermined pitch and in parallel with one another and inserting one-end portions of said radiation fins into a cavity of a diecasting mold while holding the one-end portions of the radiation fins liquid-tight;

diecasting said base portion by injecting a molten metal under a predetermined pressure and at a predetermined speed into said cavity, and integrating said radiation fins with said base portion; and forming projections on said radiation fins in the thickness direction of the same before said base portion is diecast.

3. A process for manufacturing a heat sink having a plurality of radiation fins erected from a plate-shaped base portion, comprising the steps of:

arraying said radiation fins at a predetermined pitch and in parallel with one another and inserting one-end portions of said radiation fins into a cavity of a diecasting mold while holding the one-end portions of the radiation fins liquid-tight;

diecasting said base portion by injecting a molten metal under a predetermined pressure and at a predetermined speed into said cavity, and integrating said radiation fins with said base portion; and refining a metallic structure of said radiation fins by heating and quenching them after said base portion is diecast.

4. A process for manufacturing a heat sink having a plurality of radiation fins erected from a plate-shaped base portion, comprising the steps of:

arraying said radiation fins at a predetermined pitch and in parallel with one another and inserting one-end portions of said radiation fins into a cavity of a diecasting mold while holding the one-end portions of the radiation fins liquid-tight;

diecasting said base portion by injecting a molten metal under a predetermined pressure and at a predetermined speed into said cavity, and integrating said radiations fins with said base portion; and hardening said radiation fins by pressurizing/compressing the same after said base portion is diecast.

5. A process for manufacturing a heat sink having a plurality of radiation fins erected from a plate-shaped base portion, comprising the steps of:

arraying said radiation fins at a predetermined pitch and in parallel with one another and inserting one-end portions of said radiation fins into a cavity of a diecasting mold while holding the one-end portions of the radiation fins liquid-tight;

diecasting said base portion by injecting a molten metal under a predetermined pressure and at a predetermined speed into said cavity, and integrating said radiations fins with said base portion; and surrounding a container for a heat pipe with said molten metal by arranging said container in said cavity.

6. A heat sink manufacturing process according to claim 5, further comprising a step of making up the heat pipe with the container after said molten metal solidifies by injecting working fluid within the container.

7. An apparatus for manufacturing a heat sink having a plurality of radiation fins erected from a plate-shaped base portion, comprising:

a movable mold for holding said radiation fins and spacers, as sandwiched between said radiation fins, such that one-end portions of said radiation fins are protruded from said spacers;

a stationary mold defining a cavity for molding said base portion together with said movable mold closely contacting with said stationary mold, such that the one-end portions of said radiation fins are protruded into said cavity;

means for injecting a molten metal for said base portion under a predetermined pressure and at a predetermined speed into said cavity;

engaging projections projected from the right and left sides of said spacers; and engaging grooves formed in said movable mold for engaging with said engaging projections to prevent said spacers from coming out into said cavity.

* * * * *